United States Patent

Choi et al.

[11] Patent Number: 6,084,800
[45] Date of Patent: Jul. 4, 2000

[54] CIRCUIT OF BOOSTING A VOLTAGE FOR USE IN A FLASH MEMORY DEVICE

[75] Inventors: Soo-Hwan Choi; Young-Ho Lim, both of Suwon, Rep. of Korea

[73] Assignee: Samsung Electronics, Co., Ltd., Suwon, Rep. of Korea

[21] Appl. No.: 09/389,279

[22] Filed: Sep. 2, 1999

[30] Foreign Application Priority Data

Sep. 2, 1998 [KR] Rep. of Korea ............... 98-36102

[51] Int. Cl.[7] ............................................ G11C 16/30
[52] U.S. Cl. .............................. 365/185.23; 365/185.27; 365/185.25; 365/189.09; 365/189.11; 365/226; 327/536; 327/537
[58] Field of Search ..................... 365/185.23, 185.27, 365/185.33, 189.09, 189.11, 185.25, 226; 327/536, 537

[56] References Cited

U.S. PATENT DOCUMENTS

| | | |
|---|---|---|
| 5,396,113 | 3/1995 | Park et al. ........................ 327/543 |
| 5,940,333 | 8/1999 | Chung ........................... 365/189.09 |
| 6,011,743 | 1/2000 | Khang ............................... 365/226 |

*Primary Examiner*—Andrew Q. Tran
*Attorney, Agent, or Firm*—Marger Johnston & McCollom, P.C.

[57] ABSTRACT

Disclosed is a circuit of boosting a voltage which comprises a driver circuit for generating a kick signal for driving word lines via row decoder circuits in an array of flash memory cells during read and program modes of operation. The driver circuit makes both electrodes of a large booster capacitor have the same voltage in order to allow a small charge pump to further pump up the word line voltage during programming.

7 Claims, 6 Drawing Sheets

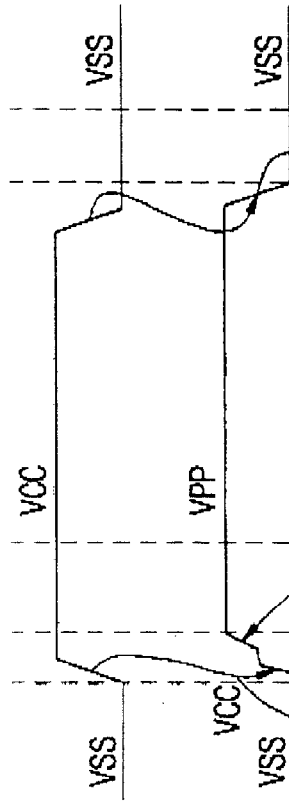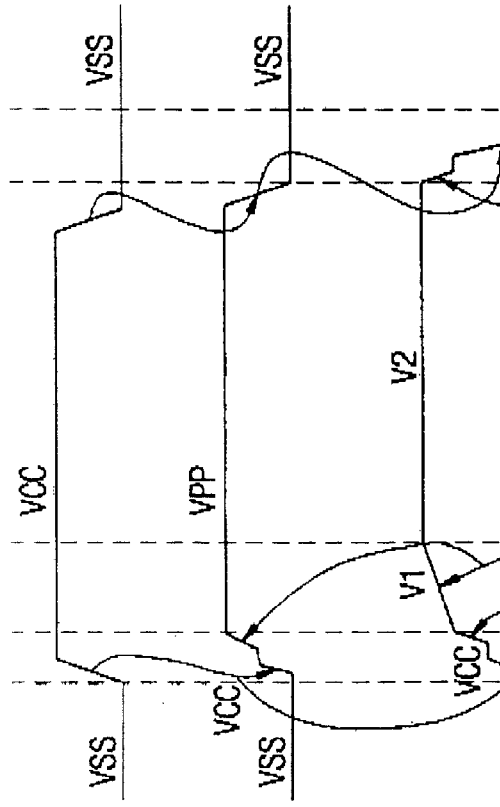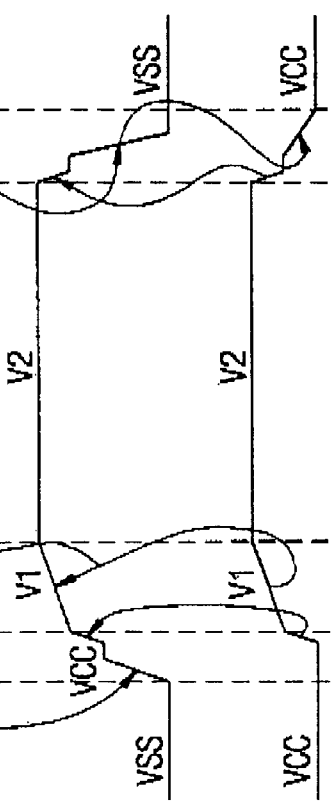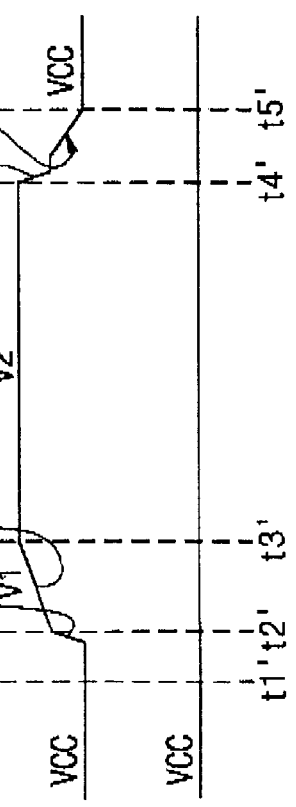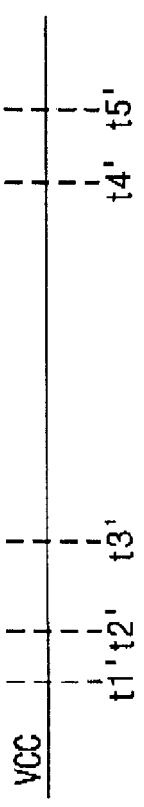

CIRCUIT OF BOOSTING A VOLTAGE FOR USE IN A FLASH MEMORY DEVICE

FIELD OF THE INVENTION

The present invention relates to voltage booster circuits, and more particularly to an improved voltage booster circuit which includes a driver circuit for generating a three-state output to drive word lines via row decoder circuits in an array of flash EEPROM memory cells during read and program modes of operation.

BACKGROUND OF THE INVENTION

As is generally known in the field of semiconductor memory devices and other semiconductor integrated circuits, it is often required to generate internally voltages that are greater than an external voltages, also known as off-chip power supply voltages. For example, it is known in flash electrically erasable, programmable read-only memories (EEPROMs) that a first high voltage of about +5V is needed to be produced for the read mode of operation of memory cells. Also, a second high voltage of about +10V is needed to be produced for the program mode of operation of the flash memory cells. To meet this requirement, the semiconductor memories also generally include one or more internal voltage boosting circuits for generating output signals boosted to be higher than an external supply voltage.

In FIG. 1, there is shown a simplified block diagram of a conventional voltage boosting circuit 10 for generating a word line voltage VPP, which is passed to appropriate word lines WL0 through WLn in a memory cell array via respective row decoder circuits 20. The voltage boosting circuit 10 includes a high voltage charge pump circuit 14 which is used during the program mode of operation of the semiconductor memory devices. The charge pump circuit 14 serves to charge up the word line voltage VPP at the internal word line supply node N1 to approximately 10V when the enable signal ENVPP is high. The boosting circuit 10 also includes a precharge logic circuit 12 which functions to precharge the word line voltage VPP to the external power supply voltage VCC, before the node N1 is boosted or pumped to a high voltage. The precharge logic circuit 12 will also maintain the supply voltage VPP equal to the external power supply voltage VCC in other modes of operation via the PMOS transistor P1. The capacitor $C_L$ represents the capacitive loading of the row decoder circuits 20, plus all of the parasitic capacitance associated with the line 2 connected to the word line supply node N1.

With reference to FIGS. 2(a) through 2(e), the operation of the voltage boosting circuit 10 depicted in FIG. 1 will now be explained. Initially, it is assumed that prior to time t1 the enable signal ENVPP and the precharge bar signal PRECHARGEB are both low (VSS), and that kick bar signal KICKB is high (VCC). Thus, the output of the NAND gate 18 on the line 3, defining the kick voltage VKICK, will be low (VSS). Further, the word line voltage VPP at the supply node N1 will be at the power supply voltage VCC, since the PMOS transistor P1 will be turned on.

When the kick bar signal KICKB makes a high-to-low transition at the time t1 as shown in FIG. 2(a), the precharge bar signal PRECHARGEB in FIG. 2 will be pulled to the power supply voltage VCC at time t2. At time t3, the kick voltage VKICK will begin making a low-to-high transition, as depicted in FIG. 2(b). This will, in turn, cause the word line voltage VPP at the supply node N1 to be raised or boosted by the kick signal VKICK via the booster capacitor $C_{BOOST}$, from an initial value of VPPinit=VCC, to a boosted level $VPP_{BOOST}$, starting at the time t3 in FIG. 2(d). As a result, the precharge bar signal PRECHARGEB will be further raised to the boosted level at time t4 as shown in FIG. 2(c).

This boosted level of the word line voltage $VPP_{BOOST}$ can be calculated from the following equation:

$$VPP_{BOOST} = VPP_{init} + \frac{C_{BOOST}}{C_{BOOST} + C_L} \times VKICK \qquad (1)$$

Where:

$$VKICK = \text{Power supply potential } VCC \qquad (2)$$

$$VPP_{init} = \text{Power supply potential } VCC \qquad (3)$$

and $C_{BOOST}$, $C_L$ are respectively the capacitances of capacitors $C_{BOOST}$, $C_L$. By substituting the equations (2) and (3) into the equation (1) and simplifying, there is given:

$$VPP_{BOOST} = VCC\left(1 + \frac{C_{BOOST}}{C_{BOOST} + C_L}\right) \qquad (4)$$

From above equation (4), it can be seen that if the required maximum for the word line voltage VPP is less than the level that can be generated by the voltage boosting circuit 10 of FIG. 1, then the conventional boosting circuit 10 will be able to operate adequately. Unfortunately, as previously pointed out, the word line voltage VPP is typically required to be pumped up to approximately +10V for the program mode of operation of the flash memory cells. Therefore, under these circumstances, an additional means is required for producing this higher voltage, such as a second higher voltage charge pump.

However, the use of the conventional voltage boosting circuit 10 for this purpose is impractical, since the total capacitance that is seen by the high voltage charge pump 14 is very high, which is because the boost capacitor 15 is constantly connected to the kick signal VKICK, which is at a value of either VCC or VSS. As a result, this conventional voltage boosting circuit 10 suffers from the disadvantage that either the charge pump 14 would require a much longer time in order to raise the voltage VPP to the necessary programming level, or the size of the charge pump 14 must be increased, so as to raise the voltage VPP to the necessary programming level in the same amount of time. The first way would increase the programming time, and the second way would increase the cost and complexity of the overall memory device. Thus, neither of these choices offers a satisfactory solution.

More specifically, this problem of the conventional circuit 10 having a high total capacitance can be illustrated by referring back to equation (2) above. If we let VPPmin be equal to the minimum VPP supply voltage required for the read mode of operation for a flash memory cell, and let VCCmin be equal to the minimum VCC power supply voltage of the flash memory cell, then we have through substitution:

$$VPP_{min} = VCC_{min}\left(1 + \frac{C_{BOOST}}{C_{BOOST} + C_L}\right) \qquad (5)$$

Further, by assuming $VPP_{min}$ to be equal to +4.2V and $VCC_{min}$ to be equal to +2.5V, there is given:

$$4.2 = 2.5\left(1 + \frac{C_{BOOST}}{C_{BOOST} + C_L}\right) \quad (6)$$

By solving for the booster capacitor $C_{BOOST}$, there is given: $C_{BOOST}=2.125C_L$. Therefore, the total capacitance $C_{TOTAL}$ has been shown to have increased due to the booster capacitor: $C_{TOTAL}=C_{BOOST}+C_L$ or $=3.125C_L$.

Accordingly, it would be desirable to provide an improved voltage booster circuit which overcomes the disadvantages of the conventional case, so as to be capable of operating efficiently and effectively in a low supply voltage environment. It would be expedient that the voltage booster circuit be operated effectively so as to produce a significant reduction in power dissipation.

SUMMARY OF THE INVENTION

It is therefore an object of the present invention to provide an improved voltage booster circuit which is capable of operating efficiently and effectively in a low supply voltage environment.

It is another object of the invention to provide an improved voltage booster circuit which can be operated efficiently so as to produce a significant reduction in power dissipation.

It is yet still another object of the present invention to provide an improved voltage booster circuit which includes a driver circuit for generating a three-state output so as to effectively disconnect the large booster capacitor, in order to allow a small charge pump to further pump up the word line voltage during programming.

In order to attain the above objects, according to an aspect of the present invention, there is provided a voltage booster circuit for generating at a word line supply node a boosted supply voltage higher than a power supply voltage for driving word lines via row decoder circuits in an array of flash EEPROM memory cells during read and program modes of operation. The voltage booster circuit comprises a transistor for selectively connecting the power supply voltage to the word line supply node in response to a precharge signal, and a charge pump circuit for pumping up the word line supply node to the boosted supply voltage during the program mode of operation in response to an enable signal. It also includes a booster capacitor and a driver circuit responsive to the enable signal, a kick bar signal, and to the boosted voltage for selectively generating a 3-state output voltage at an output node, to drive a booster capacitor. The booster capacitor is interconnected between the output node of the driver means and the word line supply node. The 3-state output voltage is at a low state during a precharge mode of operation, at a high state (or VCC) during the read mode of operation, and at a word line voltage state (or boosted supply voltage) during the program mode of operation.

The present invention provides an improved voltage booster circuit which includes a driver circuit for generating three-state outputs so as to effectively disconnect the large booster capacitor in order to allow a small charge pump to further pump up the word line volt during programming.

BRIEF DESCRIPTION OF THE DRAWINGS

The present invention will be described by way of exemplary embodiments, but not limitations, illustrated in the accompanying drawings in which like references denote similar elements, and in which:

FIGS. 7(a)–7(e) are timing diagrams of the voltages at various points in the circuit of FIG. 4 during a program mode of operation.

DESCRIPTION OF THE PREFERRED EMBODIMENT

In the following, there will be described a preferred embodiment of the present invention with reference to the drawings.

Figure 4:
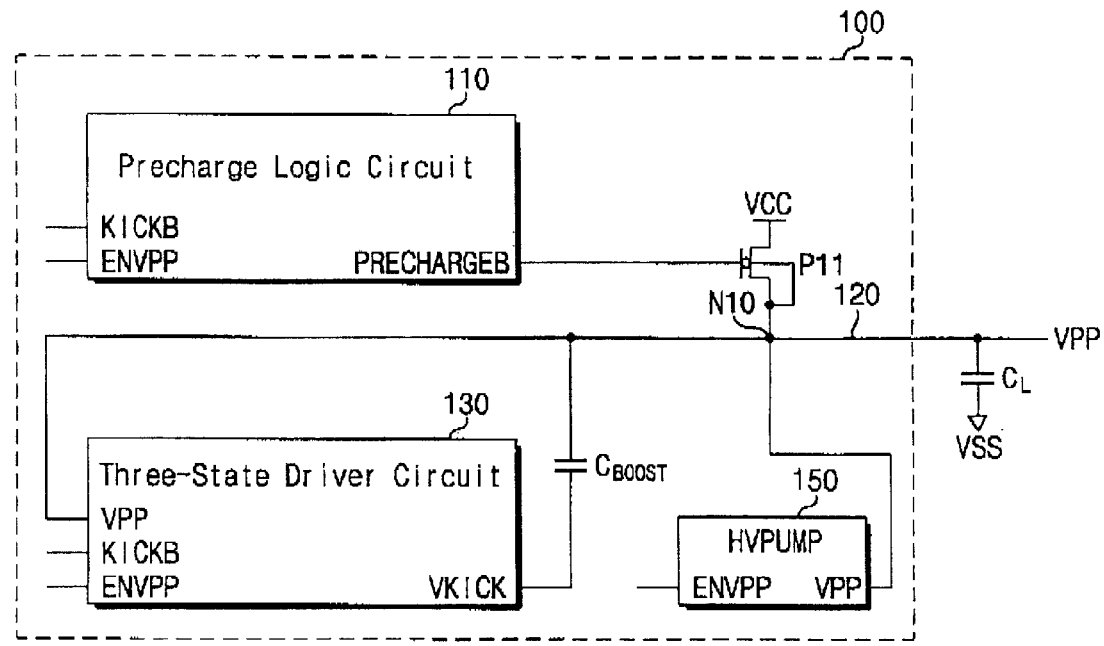
FIG. 4 is a simplified block diagram of a fast, three-state booster circuit, constructed in accordance with the principles of the present invention.

Referring to FIG. 4, there is illustrated a simplified block diagram of an improved voltage booster circuit 100, constructed in accordance with the principles of the present invention. The voltage booster circuit 100 is quite similar in its construction to the boosting circuit 10 of FIG. 1. The main difference is that the NAND gate 18 and the inverter 16 in FIG. 1 have now been replaced by a three-state driver circuit.

Figure 1:
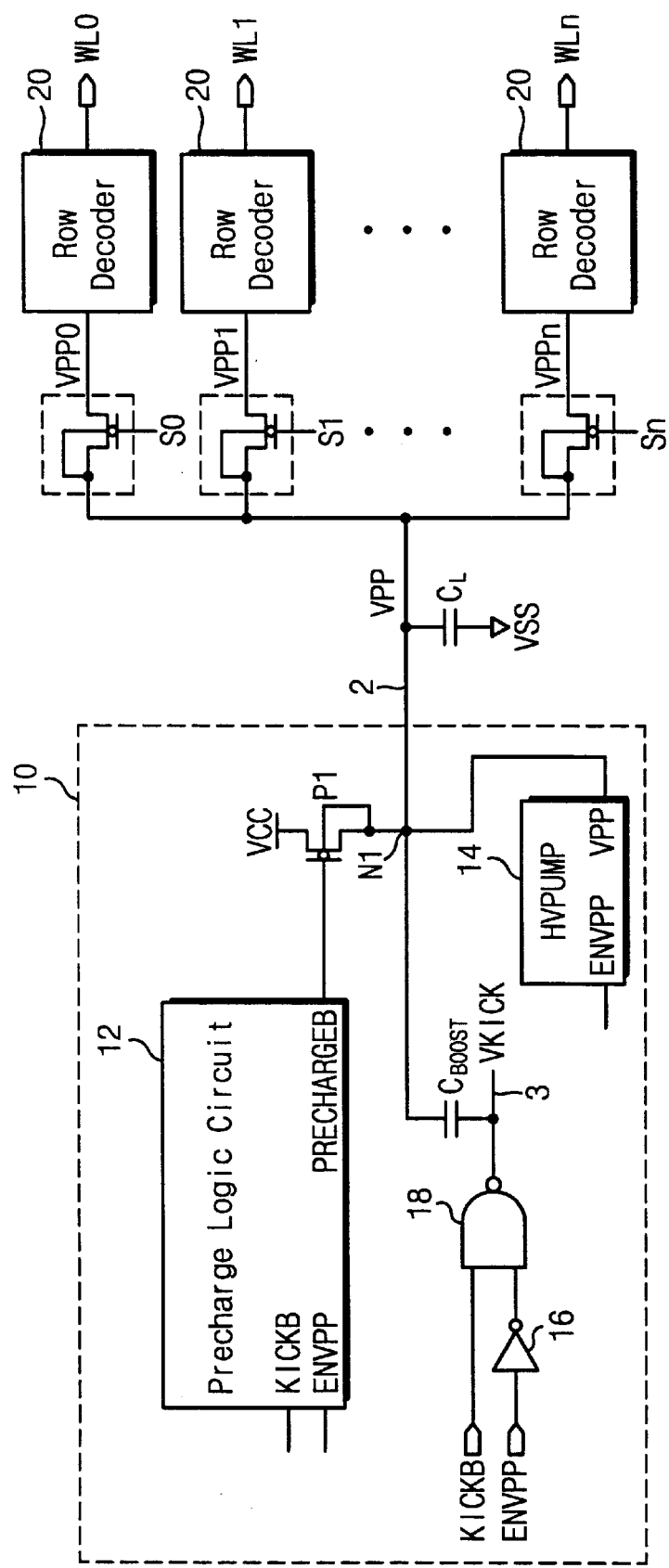
FIG. 1 is a simplified block diagram of a conventional voltage boosting circuit.

In particular, the present voltage boosting circuit 100 is comprised of a precharge logic circuit 110, a three-state driver circuit 130, a PMOS transistor P11 serving as a pull-up transistor, which is also known as a precharge circuit. It is further comprised of a booster capacitor $C_{BOOST}$, that has two terminals, and a high voltage charge pump circuit 150. Similarly, the shown capacitor $C_L$ represents the capacitive loading of the row decoder circuits (as shown in FIG. 1), plus all of the parasitic capacitance associated with the line 120 connected to a word line supply node N10 for generating the word line voltage VPP.

The driver circuit 130 has an output which is used to drive the booster capacitor $C_{BOOST}$. The output of the driver circuit 130 has three states: (1) a low state during a precharge mode, (2) a high state during a read mode, and (3) a word line voltage state during a program mode. The driver circuit 130 serves to set both electrodes of the booster capacitor $C_{BOOST}$ to the same voltage (for example, a word line voltage VPP during programming), thereby reducing the capacitive loading on the high voltage charge pump circuit 150.

Figure 5:
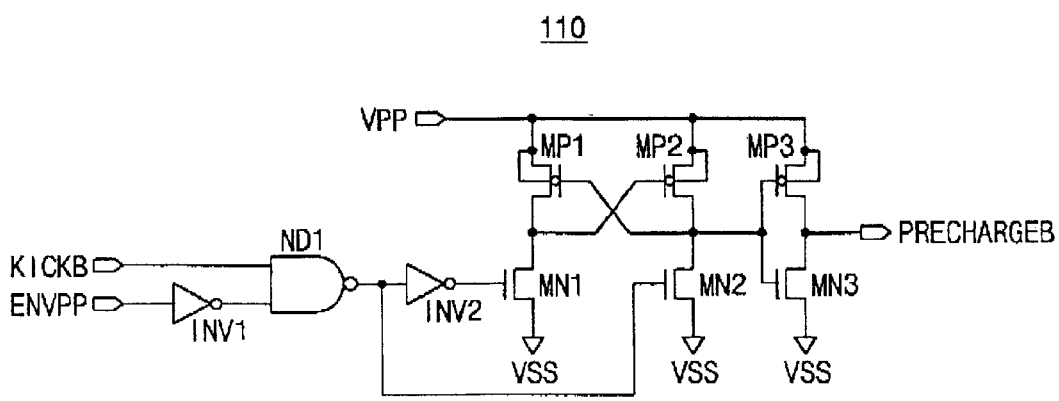
FIG. 5 is a detailed circuit diagram of the precharge logic circuit of FIG. 4.

In FIG. 5, there is shown a detailed circuit diagram of the precharge logic circuit 110 of FIG. 4. The precharge logic circuit 110 includes two inverters INV1 and INV2, one NAND gate ND1, three PMOS transistors MP1, MP2 and MP3, and three NMOS transistors MN1, MN2 and MN3.

Referring to FIG. 5, the NAND gate ND1 has one input terminal receiving the kick bar signal KICKB and the other input terminal receiving the enable signal ENVPP via the inverter INV1. The NMOS transistor MN1, whose gate is connected to an output terminal of the NAND gate ND1 via the inverter INV2, has its source grounded. The PMOS transistor MP1 has a channel connected between the word line voltage VPP and a drain of the NMOS transistor MN1. The PMOS transistor MP2 has its gate connected to the drain of the NMOS transistor MN1, its source connected to the word line voltage VPP, and its drain coupled to the drain of the PMOS transistor MP1. A gate of the NMOS transistor MN2 is tied to the output terminal of the NAND gate ND1, its drain is connected to the gate of the PMOS transistor MP1, and its source is grounded. Gates of the PMOS and NMOS transistors MP3 and MN3 are commonly connected to a common drain of the PMOS and NMOS transistors MP2 and MN2, and their channels are connected in series between the word line voltage VPP and the ground voltage VSS. The precharge bar signal PRECHARGEB is outputted from a common drain of the transistors MP3 and MN3.

Figure 6:
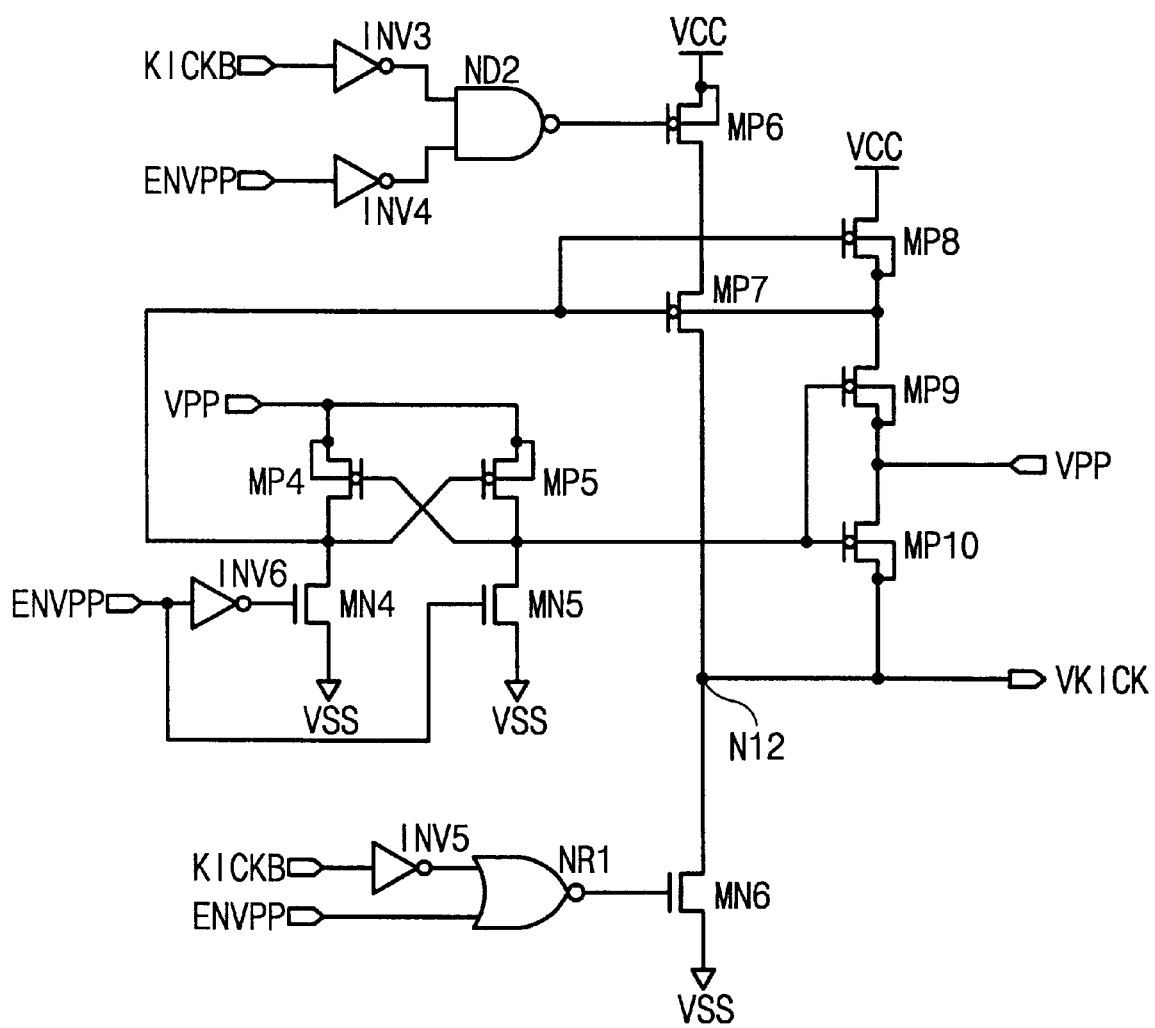
FIG. 6 is a detailed circuit diagram of the three-state driver circuit of FIG. 4.

A detailed circuit diagram of the three-state driver circuit 130 is depicted in FIG. 6. The three-state driver circuit 130 is comprised of seven PMOS transistors MP4 through MP10, three NMOS transistors MN4, MN5 and MN6, four inverters INV3, INV4, INV5 and INV6, one NAND gate ND2, and one NOR gate NR1.

Referring to FIG. 6, a drain of the NMOS transistor MN6 (serving as N-channel pull-down transistor) is connected to a node N12 for outputting the kick signal VKICK, its source is grounded, and its gate is connected to an output terminal of the NOR gate NR1. The NOR gate NR1 has one input terminal receiving the enable signal ENVPP, and the other input terminal receiving the kick bar signal KICKB via the inverter INV5. The NOR gate NR1 and the inverter INV5 constitute a pull-down transistor controller.

The NMOS transistor MN4, whose gate receives the enable signal ENVPP via the inverter INV6, has its source grounded. The PMOS transistor MP4 has its source connected to the word line voltage VPP, and its drain coupled to a drain of the NMOS transistor MN4. A gate of the PMOS transistor MP5 is connected to a common drain of the transistors MP4 and MN4, its source to the word line voltage VPP, and its drain to a gate of the PMOS transistor MP4. The NMOS transistor MN5 has its gate receiving the enable signal ENVPP, its drain coupled to the gate of the PMOS transistor MP4 and the drain of the PMOS transistor MP5, and its source grounded. The transistors MP4, MN4, MP5, and MN5 and the inverter INV6 constitute a level shifter as a pull-up transistor controller.

The NAND gate ND2 has one input terminal receiving the kick bar signal KICKB via the inverter INV3 and the other input terminal receiving the enable signal ENVPP via the inverter INV4. A source of the PMOS transistor MP6 (serving as a P-channel pull-up transistor) is connected to the power supply voltage VCC, its gate is connected to an output terminal of the NAND gate ND2, and its drain is connected to the node N12 via the PMOS transistor MP7. The gate of PMOS transistor MP7 is connected to the common drain of the transistors MP4 and MN4. The NAND gate ND2 and the inverters INV3 and INV4 constitute a pull-up transistor controller.

A channel of the PMOS transistor MP8 is connected between a bulk of the PMOS transistor MP7 and the power supply voltage VCC, and its gate is connected to the common drain of the transistors MP4 and MN4. A channel of the PMOS transistor MP9 is connected between the bulk of the transistor MP7 and the word line voltage VPP, and its gate is tied to the common drain of the transistors MP5 and MN5. And the PMOS transistor MP10 has its source connected to the word line voltage VPP, its drain coupled to the node N12, and its gate coupled to the common drain of the transistors MP5 and MN5.

A read operation of the voltage booster circuit 100 depicted in FIGS. 4 through 6 is described below, also with reference to the waveforms in FIGS. 2(a)–2(e). It is assumed that prior to time t1, the enable signal ENVPP is low, and the kick bar signal KICKB is high. According to the condition, the output of the NAND gate ND1 in the circuit 110 turns low, so that the precharge bar signal PRECHARGEB will be low.

As a result, referring to FIG. 4, the PMOS transistor P11 is turned on, thereby charging the supply node N10 up to the power supply voltage VCC.

At the same time, referring to FIG. 6, since the output of the NAND gate ND2 in the circuit 130 is high, the PMOS transistor MP6 is turned off. Similarly, the PMOS transistor MP10 is also turned off, since the common drain of the transistors MP5 and MN5 is charged with the word line voltage VPP having the same level as the power supply voltage VCC. On the other hand, the NMOS transistor MN6 is turned on via the NOR gate NR1, so that the node N12 is grounded. That is, the kick signal VKICK will be low (VSS).

Figure 2:
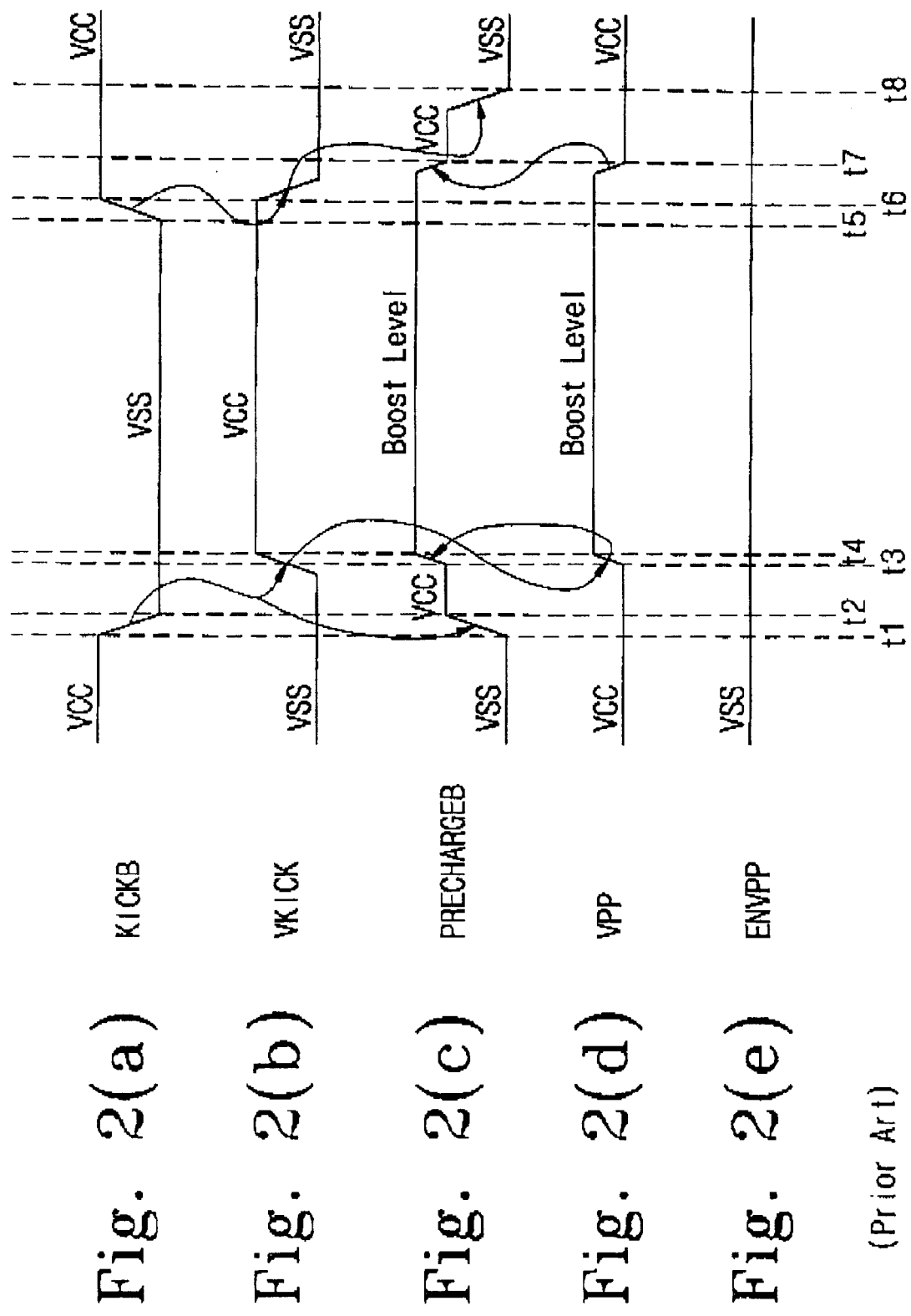
FIGS. 2(a)–2(e) are timing diagrams of the voltages at various points in the circuit FIG. 1 during a read mode of operation.

In order to initiate a read operation, the kick bar signal KICKB makes a high-to-low transition at the time t1, as shown in FIG. 2(a). This causes the output of the NOR gate NR1 to switch low, thereby turning off the NMOS transistor MN6. Simultaneously, the output of the NAND gate ND2 turns low, turning on the PMOS transistor MP6. This forces the kick signal VKICK to be pulled up to the power supply voltage VCC via the PMOS transistors MP6 and MP7 thus turned on at time t3 in FIG. 2(b). Further, since the output of the NAND gate ND1 turns to a logic high level, the precharge bar signal PRECHARGEB is at the word line voltage VPP of the precharge level (the power supply voltage VCC level) as shown in FIG. 2(c). Consequently, the supply node N10 is boosted by the kick signal VKICK via the booster capacitor $C_{BOOST}$ at the time t3. This is illustrated in FIG. 2(d). Therefore, the precharge bar signal PRECHARGEB is pulled up to the boosted level at the time t4 via the PMOS transistor MP3, as shown in FIG. 2(c).

Prior to the programming operation, the kick bar signal KICKB will make a low-to-high transition, such as at time t5 FIG. 2(a). This causes the output of the NOR gate NR1 to become high, thereby turning on the NMOS transistor MN6. The kick signal VKICK is pulled low at time t6 in FIG. 2(b). Since the word line voltage VPP is capacitively coupled to the kick signal VKICK, it will also begin to drop at time t7 as shown in FIG. 2(d). Further, as the word line voltage VPP drops to the VCC level, the kick signal VKICK and the precharge bar signal PRECHARGEB are pulled down to the ground potential VSS at the times t7 and t8, as depicted in FIGS. 2(b) and 2(c).

As a background and in order to provide an understanding of the differences in operation of the present voltage booster circuit in the programming mode, the programming operation for the conventional boosting circuit 10 in FIG. 1 will be first explained with reference to FIGS. 3(a)–3(e). It will be assumed that prior to the start of programming (before t1) the enable signal ENVPP, the kick signal VKICK, and the precharge bar signal PRECHARGEB are all low (VSS), and the word line voltage VPP and the kick bar signal KICKB are both high (VCC).

Figure 3:
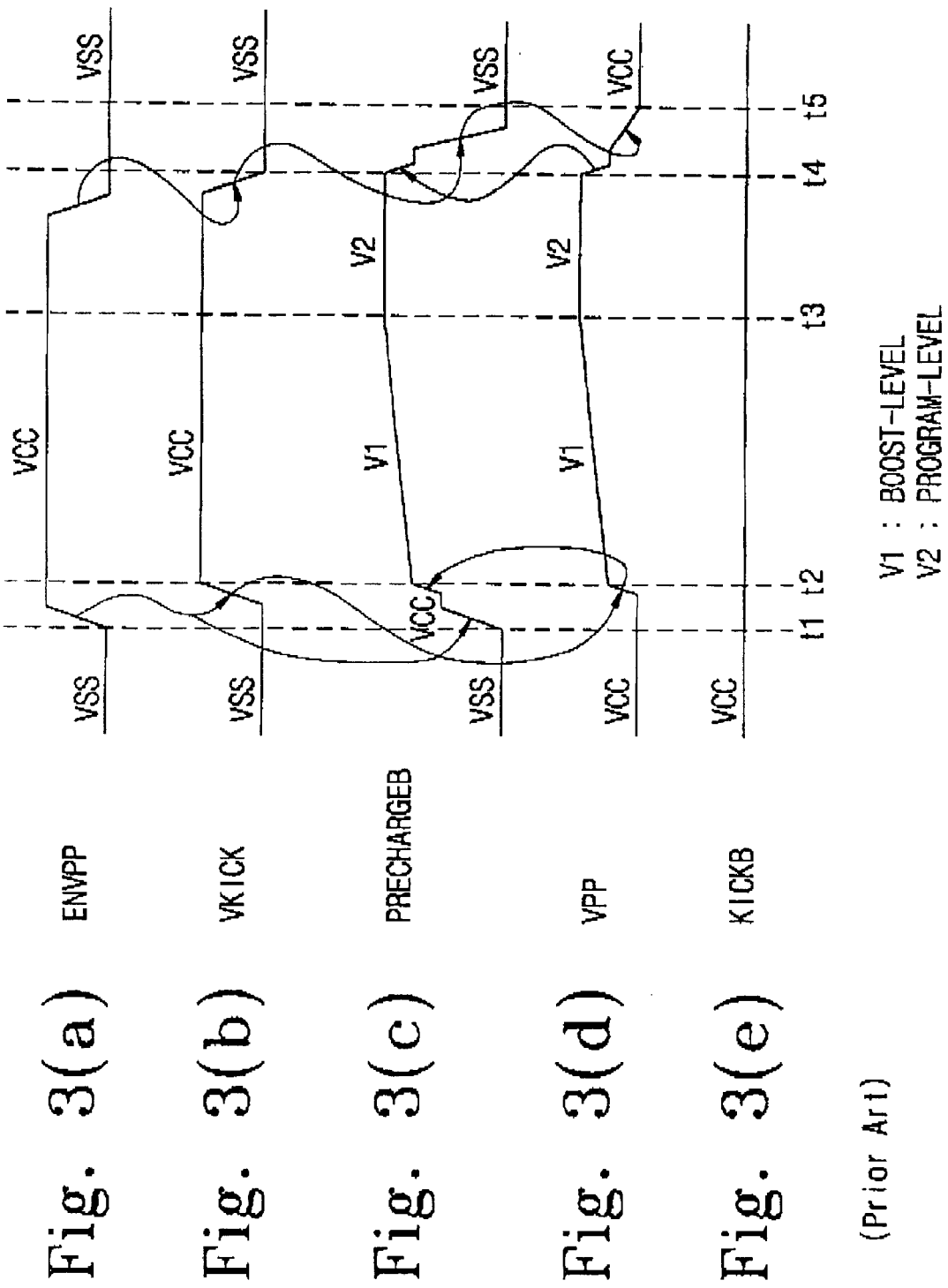
FIGS. 3(a)–3(e) are timing diagrams of the voltages at various points in the circuit FIG. 1 during a program mode of operation.

In order to initiate a program operation in FIG. 1, the enable signal ENVPP makes a low-to-high transition at time t1 in FIG. 3(a). The enable signal ENVPP triggers the kick signal VKICK, so as to boost the word line voltage VPP to the boosted level at time t2 as shown in FIG. 3(d). Also, the enable signal ENVPP activates the high voltage charge pump circuit 14, which will then further charge the word line voltage VPP up to the program level, as illustrated at time t3 in FIG. 3(d). Since the kick signal VKICK is tied to the power supply voltage VCC, the booster capacitor $C_{BOOST}$ will remain connected to the word line voltage VPP. As a result, the charge pump circuit 14 is required, to produce a more substantial amount of charge in order to raise the word line voltage VPP to the program level between the times t2 to t3 in FIG. 3(d).

In comparison, the programming operation of the present invention voltage booster circuit of FIGS. 4 through 6 is now be explained with attention directed to FIGS. 7(a)–7(e). Accordingly, in order to initiate a program operation, the enable signal ENVPP makes a low-to-high transition at time t1' in FIG. 7(a). This forces the PMOS transistors MP7 and MP8 and the NMOS transistor MN6 to be turned off, and the PMOS transistors MP9 and MN10 to be turned on. That is, the kick signal VKICK driving the booster capacitor $C_{BOOST}$ is tied to the word line voltage VPP via the PMOS transistor MP10. As the word line voltage VPP is charged by the high voltage charge pump circuit 150, the kick signal is also charged via the PMOS transistor MP10. As a result, the word line voltage VPP is charged up to a program level between the times t2' and t3', as illustrated in FIGS. 7(b) and 7(d).

As described above, the output VKICK of the driver circuit has a low (VSS) state during a precharge mode, a high state (VCC) during a read mode, and a word line voltage state during a program mode. Both plates of the booster capacitor $C_{BOOST}$ are set at the word line voltage VPP during programming, so that only the capacitive load $C_L$ is charged by the charge pump circuit 150. Therefore, a time required to charge the word line voltage VPP up to the program level (t3'–t2') is much shorter than that of the conventional voltage booster circuit 10 (t3–t2). Furthermore, a time required for discharging the word line voltage VPP of the program level (t5'–t4') is shorter than that of the conventional voltage booster circuit 10 (t5–t4).

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A voltage booster circuit for generating at a word line supply node a boosted supply voltage higher than a power supply voltage for driving word lines via row decoder circuits in an array of flash EEPROM memory cells during read and program modes of operation, comprising:

a precharge circuit for selectively connecting the power supply voltage to the word line supply node in response to a precharge signal;

a charge pump circuit for pumping up the word line supply node to the boosted supply voltage during the program mode of operation in response to an enable signal;

a booster capacitor having a first terminal connected to the word line supply node and a second terminal; and a driver circuit responsive to the enable signal, to a kick bar signal, and receiving the boosted voltage, for selectively generating a 3-state output voltage at an output node for driving the second terminal of the booster capacitor, wherein the 3-state output voltage is at a low state during a precharge mode of operation, at a power supply voltage during the read mode of operation, and at a boosted supply voltage state during the program mode of operation.

2. The voltage booster circuit according to claim 1, wherein the precharge circuit is comprised of a PMOS transistor having its source connected to the power supply voltage, its gate connected to the precharge signal, and its drain connected to the word line supply node.

3. The voltage booster circuit according to claim 2, further comprising a precharge logic circuit for generating the precharge signal which is at a low state so as to precharge the word line supply node to the power supply voltage prior to the read mode of operation.

4. The voltage booster circuit according to claim 1, wherein the charge pump circuit comprises a high voltage charge pump.

5. The voltage booster circuit according to claim 1, wherein the driver circuit comprises:

a first switch transistor connected between the output node and a ground voltage;

a first switch controller for switching the first switch transistor on or off in response to the enable and kick bar signals;

a second switch transistor connected between the power supply voltage and the output node;

a second switch controller for switching the second switch transistor on or off in response to the enable and kick bar signals;

a third switch transistor connected between the word line voltage and the output node; and a third switch controller for switching the third switch transistor on or off in response to the enable signal.

6. The voltage booster circuit according to claim 5, wherein the first switch is comprised of a N-channel pull-down transistor, and wherein the second and third switches are comprised of a P-channel pull-up transistor, respectively.

7. The voltage booster circuit according to claim 5, further comprising:

a fourth switch transistor connected between the second switch transistor and the output node;

a fifth switch transistor connected between the power supply voltage and a bulk of the fourth switch transistor; and a sixth switch transistor connected between the bulk of the fourth switch transistor and the word line voltage, wherein the fourth and fifth switch transistors are turned on by the third switch controller, while the third and sixth switch transistors are turned off by the third switch controller, and vice versa.

* * * * *